United States Patent [19]

Firmain

[11] Patent Number: 5,146,190
[45] Date of Patent: Sep. 8, 1992

[54] CIRCUIT FOR THE SWITCHING OF A MICROWAVE OUTPUT SIGNAL TOWARDS A FIRST OR SECOND OUTPUT

[75] Inventor: Gérard Firmain, Bruyeres le Chatel, France

[73] Assignee: Thomson Tubes Electroniques, Boulogne Billancourt, France

[21] Appl. No.: 648,273

[22] Filed: Jan. 31, 1991

[30] Foreign Application Priority Data

Feb. 16, 1990 [FR] France ................ 90 01878

[51] Int. Cl.[5] .............................................. H01P 5/12
[52] U.S. Cl. ................................. 333/117; 333/101
[58] Field of Search ............... 333/117, 124, 136, 138, 333/139, 156, 101, 24 R; 330/124 R, 295

[56] References Cited

U.S. PATENT DOCUMENTS

| | | | |
|---|---|---|---|
| 3,058,071 | 10/1962 | Walsh | 333/11 |
| 3,419,821 | 12/1968 | Jones | 333/7 |
| 3,423,688 | 1/1969 | Seidel | 333/117 |
| 4,010,426 | 3/1977 | Rambo | 330/53 |
| 4,124,852 | 11/1978 | Steudel | 333/136 |
| 4,477,781 | 10/1984 | Reuss | 330/124 R |
| 4,531,105 | 7/1985 | Kumar | 333/117 |
| 4,549,152 | 10/1985 | Kumar | 333/156 |
| 4,701,716 | 10/1987 | Poole | 330/43 |
| 4,841,262 | 6/1989 | Lomangino | 333/117 |
| 5,019,793 | 5/1991 | McNab | 333/139 |

OTHER PUBLICATIONS

Telecommunications and Radio Engineering, vol. 37/38, No. 1, Antonenko et al.

Primary Examiner—Eugene R. LaRoche
Assistant Examiner—A. Zarabian
Attorney, Agent, or Firm—Roland Plottel

[57] ABSTRACT

Disclosed is a circuit for switching a microwave output signal over to a first or a second output. The circuit has: two amplifiers receiving, at input, two parts, substantially equal in power, of an input signal, a coupler having two inputs connected to the outputs of the amplifiers and two outputs forming the outputs of the switching circuit, controllable phase-shifting means to place the signals injected at input of the coupler in phase or in phase opposition and to obtain the output signal sometimes at one output of the coupler and sometimes at the other output. The device can be applied to antenna switching circuits.

11 Claims, 4 Drawing Sheets

CIRCUIT FOR THE SWITCHING OF A MICROWAVE OUTPUT SIGNAL TOWARDS A FIRST OR SECOND OUTPUT

BACKGROUND OF THE INVENTION

1. Field of the Invention

The present invention relates to a circuit for switching a microwave signal to a first output or a second output. This signal is preferably a power signal. It also relates to a switching device including several switching circuits.

This switching circuit and switching device are designed notably for the switching over of the supply to antennas. It enables a signal delivered by the final power stage of a transmitter to be sent towards an antenna chosen from among several antennas.

2. Description of the Prior Art

In certain applications, a power signal coming from a final stage of a transmitter has to be directed towards a particular use, for example an antenna illuminating a particular illumination zone. Telecommunications satellites may include antennas successively illuminating distinct zones. A signal re-amplified in a transponder has to be oriented towards the antenna corresponding to the zone to be illuminated, as a function of the traffic to be conveyed.

In certain radar systems, a signal coming out of a transmitter has to be sent, sometimes to a so-called main antenna and sometimes to a so-called control antenna.

In existing switching circuits, the switching is done at output of the final power stage of the transmitter by means of a commutator or changer switch.

This changer switch may be mechanical or electro-mechanical, or it may be a ferrite switch. It may be controlled by hand or it may be remote-controlled. In any case, it has to switch over signals having high peak power values of up to several kilowatts and mean power values ranging from several tens to several hundreds of watts.

These standard switching circuits have several drawbacks.

At high power, the transmission losses in the changer switch may attain levels of the order of one decibel. For an antenna to radiate a given power value, the final stage of the transmitter should give about 25% of power in addition to the power radiated by the antenna. The transmission losses in the changer switch call for the use of a special cooling device.

The reliability of the power changer switches decreases, firstly, with the level of power brought into play and, secondly, with the number of switch-over operations per unit of time.

Should there be a failure in the power stage of the transmitter, there is a standard method used to avoid any interruption in the transmission: this method uses two identical amplification chains. Only one chain is in operation while the other chain is passive, in a state of redundancy. An additional changer switch has to be used to make the passive amplification chain active if need be. The additional changer switch doubles the transmission losses. Each of the amplification chains must give about 60% of additional power with respect to the power radiated by the antenna, if it is considered that each changer switch has losses of one decibel.

In satellite telecommunications systems, the levels of power transmitted by the onboard transponder do not presently go beyond 300 watts CW. However, the losses of the changer switches and their limited reliability greatly limit the performance characteristics of such systems.

On the ground, the transmitted power values are highly variable and may range from some watts to some megawatts.

SUMMARY OF THE INVENTION

The present invention seeks to overcome these drawbacks. It proposes a switching circuit including two amplification chains, supplied with parts of an input signal that are substantially equal in power. The outputs of the amplification chains are combined in a coupler with low losses. At input of the coupler, controllable phase-shifter means set up signals in phase or in phase opposition so as to obtain the sum of the output signals of the amplification chains, either on one output of the coupler or on the other output.

The invention also proposes a switching device including $2^n$ switching circuits.

The switching circuit according to the invention is designed to switch over an output signal to a first or a second output. It has a coupler with two inputs and two outputs which form the outputs of the circuit.

At input, two amplifiers receive two parts, substantially equal in power, of an input signal to be amplified, and each amplifier supplies one input of the coupler.

Controllable phase-shifting means, positioned upline of at least one of the amplifiers, place the signals present at input of the coupler in phase or in phase opposition so as to obtain the output signal sometimes at one output of the coupler and sometimes at the other output.

Preferably, a divider coupler is supplied with an input signal and gives the parts of the input signal, that are substantially equal in power, at two outputs.

Preferably, the amplifiers are substantially identical and the coupler is a so-called "180." coupler.

The controllable phase-shifting means are set up by at least one controllable variable phase-shifter inserted between an output of the divider coupler and the input of the corresponding amplifier.

At the input of the amplifiers, it is possible to provide for a device for the equalization of the electrical lengths between the input and the output of the amplifiers.

At the input of the amplifiers, it is also possible to provide for a device for the equalization of the amplitudes of the output signals of the amplifiers.

A servo-control circuit receiving at least one output signal from the coupler may control the equalization devices.

A load device is connected to each output of the switching circuit.

A band filter may be inserted between each output of the switching circuit and each load device. These filters may be centered on different frequencies, it being possible for the switching circuit to switch signals over to different frequencies.

The invention also proposes a device for the switching over of an output signal to one output taken from among $2^{n+1}$ outputs, said device having $2^n$ switching circuits as described here above. The inputs of the $2^n$ switching circuits are supplied by the outputs of a cascade of n stages of divider couplers and controllable phase-shifting means.

The outputs of the $2^n$ switching circuits are connected to the inputs of a cascade of n stages of $2^{n+1}$ couplers with $2^n$ couplers in each stage.

Each order i stage of divider couplers and phase-shifting means includes $2^{i-1}$ divider couplers and $2^{i-1}$ phase-shifting means all controllable simultaneously for the stage considered, to set up, at the output of each divider coupler/phase-shifter means set, signals that are either in phase or in phase opposition, designed to be applied to the inputs of the divider couplers of the order i+1 stage.

Each of the inputs of the couplers of an order i stage is connected to an output of a different coupler of the order i−1 stage.

At the most, $2^{n+1}$ load circuits are connected to the outputs of the $2^n$ couplers of the order n stage. A matched load is connected to the outputs of the $2^n$ couplers of the order n stage not connected to a load circuit.

BRIEF DESCRIPTION OF THE DRAWINGS

Other characteristics and advantages of the invention will appear from the following description, which is given on a non-restrictive basis and is illustrated by the appended figures, of which.

In these figures, the same references are repeated for the same references.

DETAILED DESCRIPTION OF THE INVENTION

Figure 1:
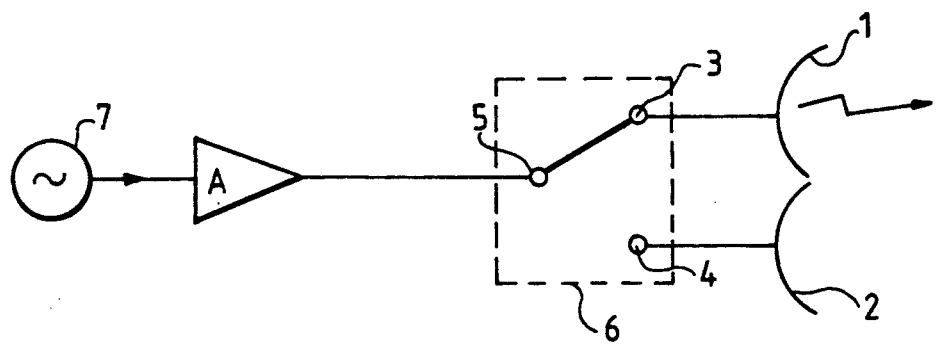
FIG. 1 shows a switching circuit with two outputs according to the prior art.

The circuit shown in FIG. 1 is used for the switching over of two antennas 1, 2. It has a regulator 7 that gives a signal to be amplified. The output of the regulator 7 is connected to the input of an amplifier A. The output of the amplifier A is connected to the input 5 of a changer switch 6. This changer switch 6 has two outputs 3, 4 respectively connected to the antennas 1 and 2. The signal given by the regulator will be amplified in the amplifier A and, depending on the position of the switch 6, it will feed either the antenna 1 or the antenna 2.

In FIG. 1, the amplified signal comes out of the changer switch 6 by its output 3 and supplies the antenna 1. The antenna 2 is not supplied. The regulator 7 and the amplifier A may form part of the final stage of a transmitter. The amplifier A may be a microwave tube such as a T.W.T. or a klystron or a solid state amplifier. The changer switch 6 may be mechanical or electromechanical or it may be a ferrite switch. It may be controlled by hand or remote controlled.

Figure 2:
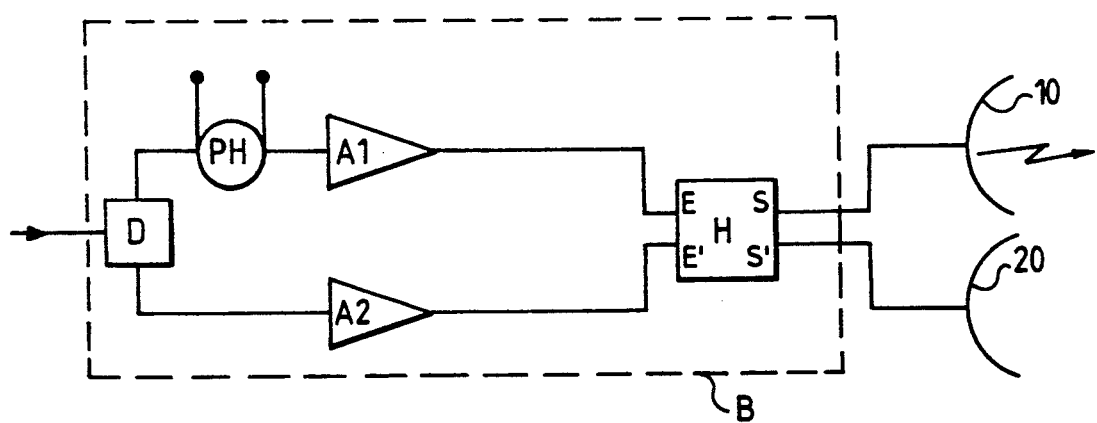
FIG. 2 shows a dual-output switching circuit according to the invention.

FIG. 2 shows a switching circuit B with two outputs according to the invention. Two amplifiers A1, A2 are used. It may be assumed that these are two substantially identical amplifiers, for example travelling wave tubes. It is also possible to use solid state amplifiers or amplifiers set up with hybrid circuits.

These amplifiers A1, A2 each receive a part, substantially equal in power value, of an input signal. Here it is half of the power of the input signal. A divider coupler D, working in a well-known way as a power divider by two, is used.

At its input, this coupler D receives the input microwave signal and, at its two outputs, it gives a signal, the power of which is half of the input power.

The input signal is given by a regulator (not shown).

The output of the amplifiers A1, A2 is respectively connected to the two inputs E, E' of a coupler H. The two outputs S, S' of the coupler H form the two outputs of the switching circuit.

The coupler H is a so-called "180." coupler. It works as follows: if the signals supplying the inputs E and E' have any phase shifts, the vector sum and the vector difference of the signals present at input will be obtained respectively at its sum output S and its difference output S'.

If the signals supplied to the inputs E and E' are in phase, their sum will be obtained at S and their difference (i.e. substantially no signal) will be obtained at S'. If the signals supplied to the inputs E and E' are in phase opposition, their sum will be obtained at S', and substantially nothing will be obtained at S.

The coupler H could be formed by a magic T circuit in guide form or by a magic T circuit in triplate strip line form, on a ceramic circuit for example. These couplers have low losses of generally less than a tenth of a decibel.

Hereinafter, for convenience's sake, the same reference will be used to designate equally an input or an output of the coupler and the signal present at this input or this output.

The switching circuit includes at least phase-shift means controllable so that the signals applied to the input of the coupler are either in phase or in phase opposition.

FIG. 2 shows a controllable, variable phase-shifter PH inserted between an output of the divider coupler D and the input of the amplifier A1. This is only an example. It could have been placed at the input of the amplifier A2. Two variable phase-shifters could have been used, one connected to the input of the amplifier A1 and the other to the input of the amplifier A2. The two phase-shifters would be controlled simultaneously.

The controllable variable phase-shifter PH may be a ferrite phase-shifter, a PIN diode phase-shifter or even a mechanical one. This depends on the desired switch-over time. It works at a low power level because it is upline of the amplifiers.

These two outputs S, S' are each connected to a load device. FIG. 2 shows two antennas 10, 20 and the switching circuit according to the invention makes it possible to switch the input signal over after amplification, sometimes to one antenna 10 and sometimes to the other antenna. It is possible to envisage a case where the switching circuit is used for other applications, for example in microwave ovens or sections of particle accelerators.

For the antenna 10 to be supplied, the signals E and E' should be in phase. The variable phase-shifter PH is controlled accordingly so that the input signals of the coupler are in phase. At its output S, the coupler H gives the sum of the output signals of the amplifiers A1 and A2 and substantially nothing at its outputs S'.

If, on the contrary, the antenna 20 is supplied, the signals E and E' should be in phase opposition. The variable phase-shifter PH is controlled so that the input signals of the coupler are in phase opposition. The variable phase-shifter PH is controlled so that the input signals of the coupler are in phase opposition. The sum of the signals E and E' is obtained at the output S' and substantially nothing is obtained at the output S.

The switching circuit according to the invention enables signals with a high level of power to be combined in a low loss coupler, and the switching over is achieved by controlled phase-shifting means working on signals with low power levels.

In many cases, the antennas 10, 20 respectively radiate signals at different frequencies and operate in succession. Band filters FLT1, FLT2 may be placed respectively between the outputs S, S' of the coupler H and the antennas 10, 20. The filter FLT1 will let through only signals at the frequency F1 and the filter FLT2 will let through only signals at the frequency F2. This variant is shown in FIG. 3.

Figure 3:
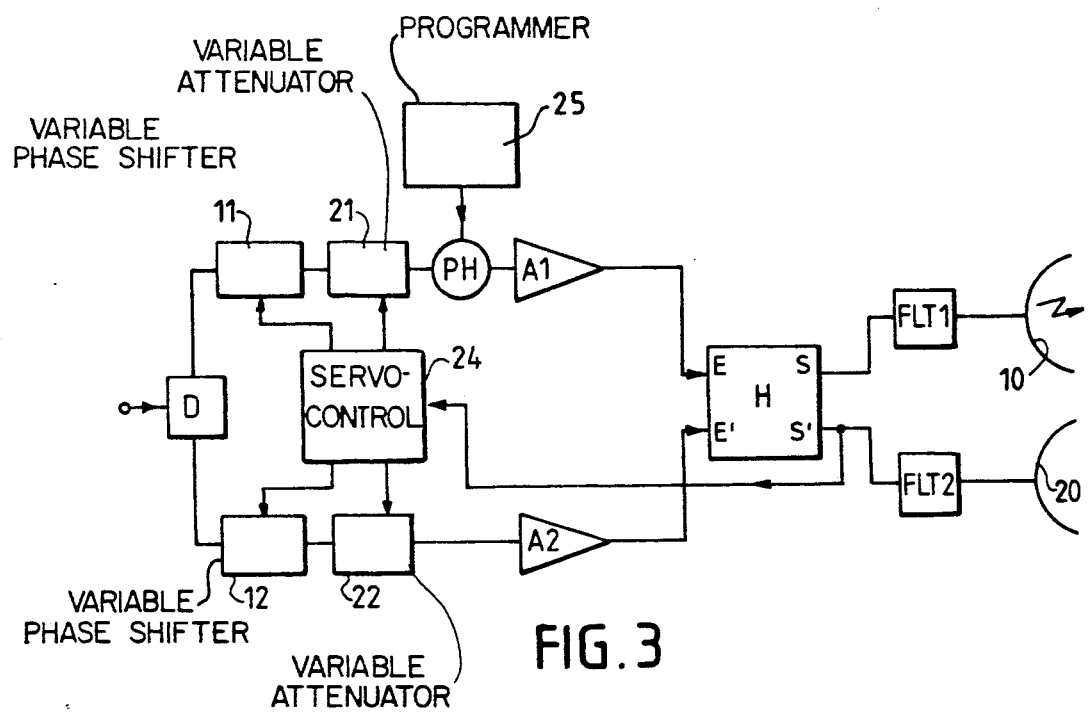
FIG. 3 shows a variant of the same dual-output switching circuit according to the invention.

This FIG. 3 also shows a device that makes it possible, if necessary, to automatically compensate for possible differences in the two amplification chains.

To this end, the invention uses firstly a device the outputs of the divider D and the outputs S,S' of the coupler H and, secondly, a device for the equalization of the amplitudes of the signals E and E' at input of the coupler H.

To equalize the electrical lengths, it is possible to place a variable phase-shifter 11, 12 respectively at the input of each amplifier A1, A2.

To equalize the power levels, a variable attenuator 21, 22 can be placed respectively at the input of each amplifier A1, A2, in series with the variable phase-shifters 11, 12.

The variable phase-shifters 11, 12 and the variable attenuators 21, 22 have been shown between the divider D and the variable phase-shifter (or phase-shifters) PH, but they could have been inserted between the variable phase-shifter or phase-shifters and the input of the amplifiers A1, A2.

The variable phase-shifters 11, 12, on the one hand, and the variable attenuators 21, 22, on the other hand, are controlled differentially by a standard servo-control circuit 24 which is itself controlled by at least one of the output signals S' or S.

It is also possible to envisage the use of a programming device 25 to control the variable phase-shifter PH.

A switching circuit according to the invention has numerous advantages as compared with prior art circuits using power changer switches.

We now refer to FIG. 2.

Each amplifier A1, A2 should give power of about P/2 for the power radiated by one of the antennas 10 or 20 to be equal to P.

In the prior art circuit, shown in FIG. 1, the amplifier A should give power of about 1.25 p in order that P may be radiated by one of the antennas 1 or 2.

The two amplifiers A1 and A2 are 2.5 to 3 times less powerful than the amplifier A, and their reliability is increased.

The cost of two average-powered amplifiers is generally smaller than that of only one high-powered amplifier.

The switching is achieved by a variation in phase of the signals having a low level of power. The reliability of the switching is increased in relation to that of the standard switch circuits where the switching is done on circuits with a high level of power.

The fact of using two amplification chains in parallel makes it possible to derive benefit from the well-known advantages of the parallel connection of amplifiers. The noise factor of the circuit is equal to that of one of the amplifiers, and this factor is all the smaller as the output power of the amplifiers is low. The level of harmonics is reduced, the standing wave ratio (S.W.R.) is improved.

A switching circuit according to the invention can continue to operate if one of the amplifiers is malfunctioning.

We now refer to FIG. 3. It is assumed that the amplifier A1 is malfunctioning and that it is desired to supply the antenna 10 with a signal at a frequency F1. Let P/2 be the power present at the output of the amplifier A2. The input E of the coupler H receives nothing. The input E' of the coupler H receives the power P/2.

Each output S, S' gives a signal at the frequency F1, the power of which is P/4. The filter FLT2 does not let through the signal coming from S' since it is at the frequency F1. The signal coming from S' is reflected by the filter FLT2 towards S'. This power P/4 is divided into two equal parts between the inputs e and E' of H. If the balance is assessed, it is seen that a power signal P/4 supplies the antenna 10. This power level makes it possible to carry out the task during the time when the balance of the connection remains acceptable for the system. In making an assessment of the balance of the connection, the worst conditions of propagation are taken into account. With a given power level, the performance of the task is ensured for N% of the time (for example 99.9%). With a power level of below 6 dB, it will still be ensured for N'% of the time (for example 95%).

Since the power P/4 returns from the filter FLT2 towards S, a power value of P/8 returns by the inputs E and E' and should be dissipated in the amplifiers A1, A2. This power level is generally acceptable and does not risk damaging the active amplifier A2 if this amplifier, like A1, is properly designed.

Figure 4:
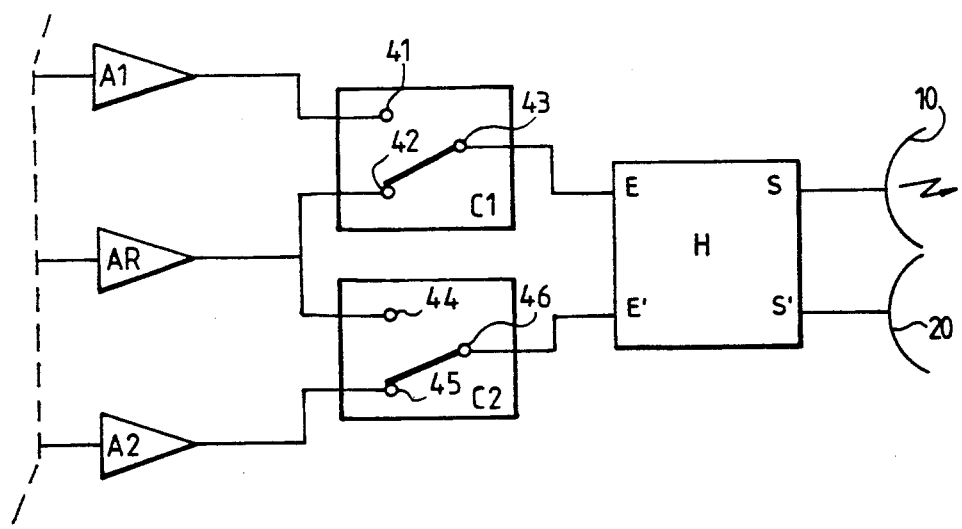
FIG. 4 shows a partial view of a dual-output switching circuit working in degraded mode with a redundant amplifiers.

Should the signals that successively supply the antennas 10, 20 be at the same frequency, the use of a redundant amplifier will be preferred. We now refer to FIG. 4. The redundant amplifier bears the reference AR. The figure does not show that part of the switching circuit placed upline of the amplifiers A1, A2, AR. The output of the amplifier AR may be switched over, by means of two changer switches C1, C2, either to the input E of the coupler H if the amplifier A1 is malfunctioning or to the input E' of the coupler H if the amplifier A2 is malfunctioning. If the amplifiers A1 and A2 work normally, the amplifier AR is passive.

The changer switch C1 has two inputs 41, 42 and an output 43. The input 41 is connected to the output of A1, the input 42 is connected to the output of AR. The output 43 is connected to the input E of the coupler H.

The changer switch C2 has two inputs 44, 45 and an output 46. The input 44 is also connected to the output of AR, the input 45 is connected to the output of A2. The output 46 is connected to the input E' of the coupler H.

It is assumed that the amplifier A1 is malfunctioning. It is desired to supply the antenna 10. The changer switch C1 switches over the signal present at its input 42 to the output 43. The output signal of the amplifier AR is present, apart from losses, at the input E of the coupler H. The changer switch C2 switches over the signal present at its input 45 to its output 46. The output signal of the amplifier A2 is present, apart from losses, at the input E' of the coupler H. For the antenna 10 to be supplied, the signals at E and E' should be in phase.

In this configuration with redundancy, each amplifier gives a power value which is half that given by each of the amplifiers used in the standard circuits with two identical amplification chains. The two changer switches work with a lower power, and their reliability is increased.

From the viewpoint of costs, the cost of three average-powered amplifiers is generally lower than that of two high-powered amplifiers.

Figure 5:
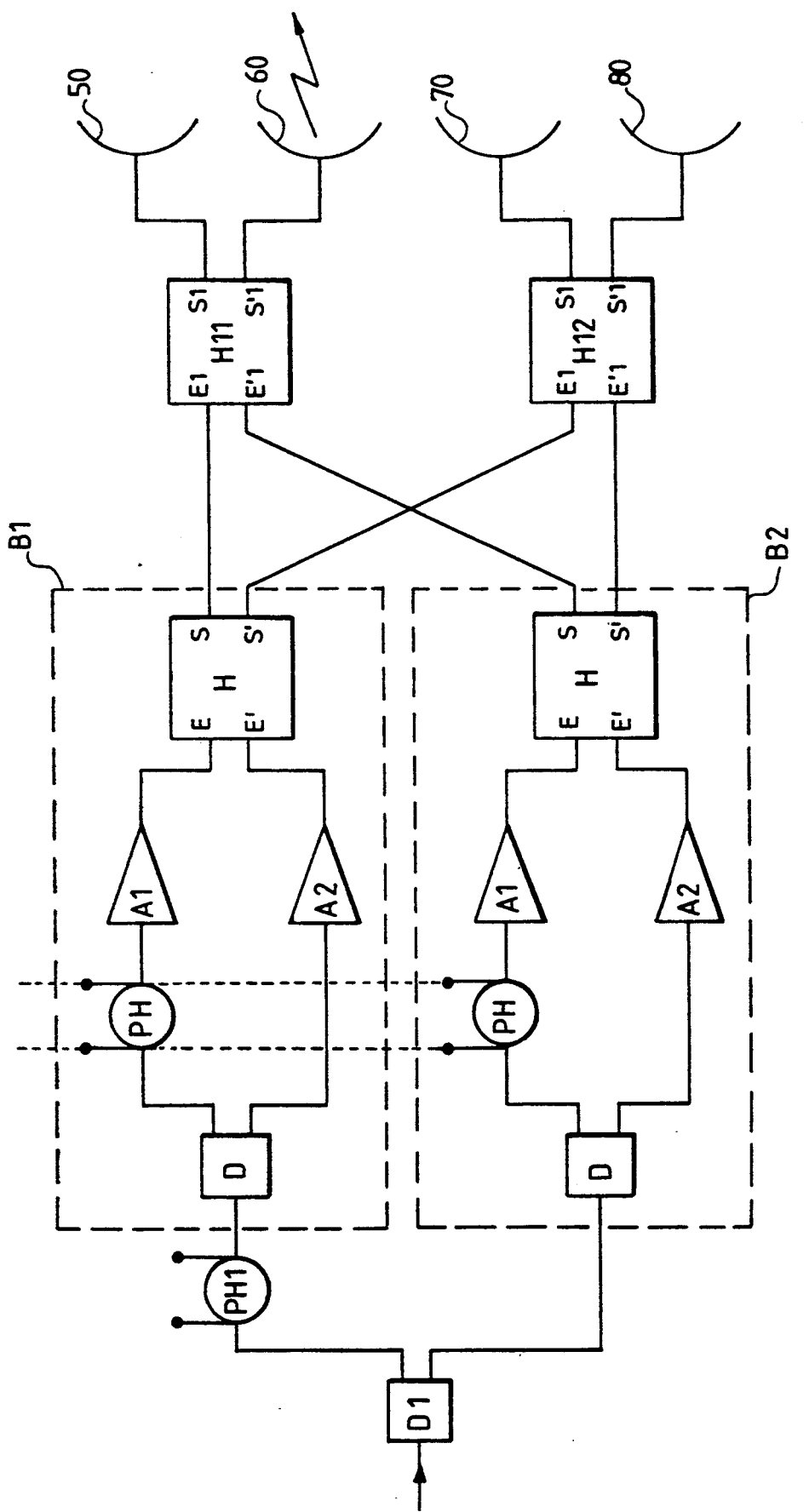
FIG. 5 shows a four-output switching device according to the invention.
Figure 6:
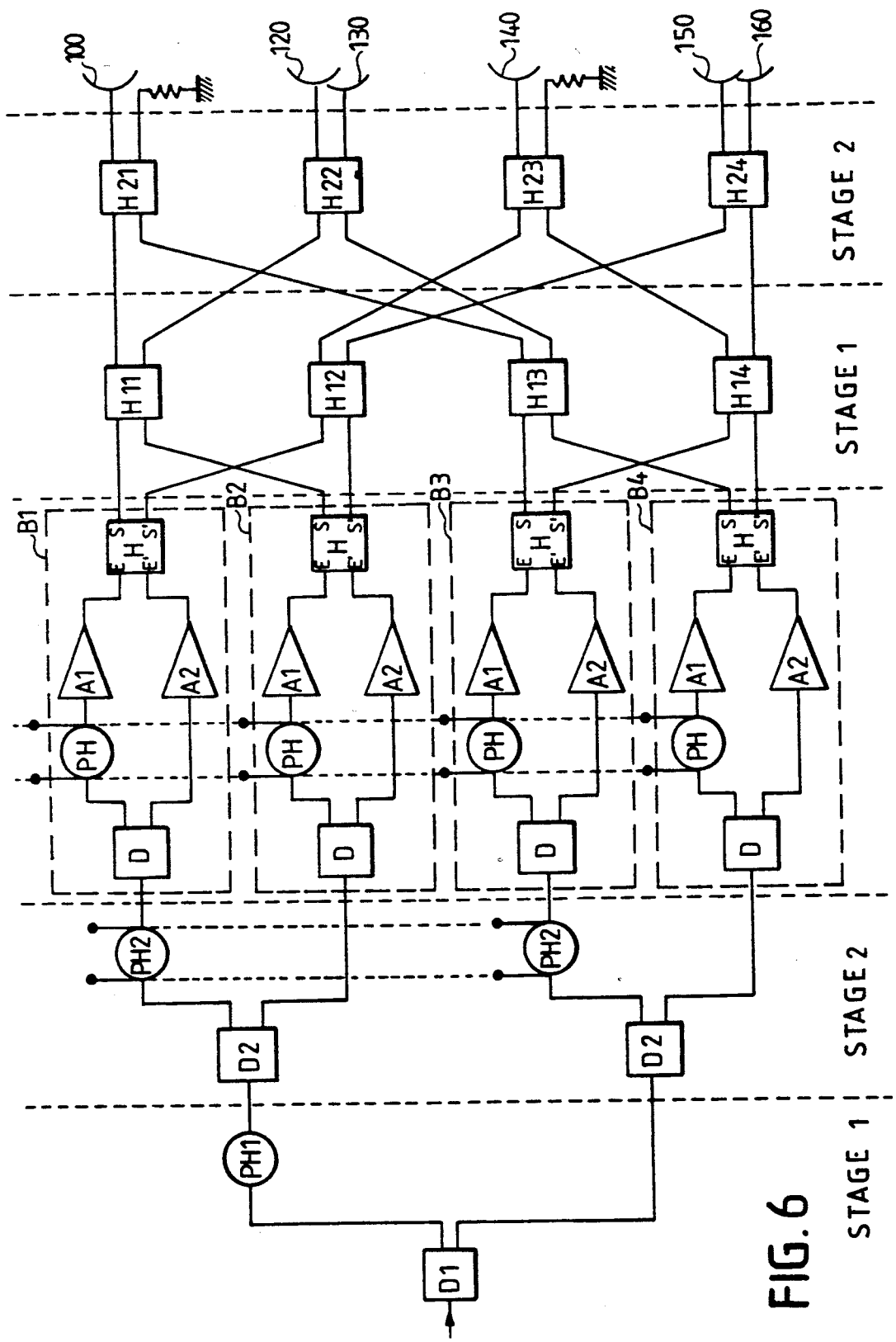
FIG. 6 shows an eight-output switching device according to the invention.

It may be necessary to switch over a signal to an output chosen from among $2^{n+1}$ (n being an integer greater than or equal to n). A switching device having $m = 2^n$ switching circuits B1, ... Bm according to the invention will then be used. FIG. 5 shows a device such as this with n = 1 and FIG. 6 shows another device with n = 2.

In practice, n will take the value 1 and four outputs will be used.

The inputs of the $2^n$ switching circuits B1, ... Bm are supplied by the outputs of a cascade with n stages of dividers D1, ... Dn and controllable phase-shifter means PH1, PH2, ... PHn.

The outputs S, S' of the $2^n$ switching circuits B1, ... Bm are connected to the inputs E1, E'1 of a cascade with n stages of couplers H11 ... H1m, H21 ... H2m, Hn1 ... Hnm. There are m couplers per stage.

Each order i stage of dividers and phase-shifting means includes $2^{i-1}$ dividers Di and $2^{i-1}$ phase-shifting means PHi all controllable simultaneously for the stage i. These $2^{i-1}$ phase-shifting means PHi set up signals, either in phase or in phase opposition, at output of each divider and phase-shifter means. These signals are applied to the inputs of the dividers Di + 1 of the order i + 1 stage.

The input Ei of a coupler Hij is connected to one of the outputs Si−1 or S'i−1 of a coupler Hi−1,k of the order i−1 stage. The input E'i of the same coupler Hij is connected to one of the outputs Si−1, S'i−1 of another coupler Hi−1,l with l different from k. The couplers Hi−1,k, Hi−1,l belong to the order i-1 stage, and the coupler Hij to the order i stage.

The input of the switching device is set up at the input of the divider D1. An input signal is injected into it before amplification.

The $2^{n+1}$ outputs of the device are located at the level of the outputs Sn and S'n of the couplers Hn1, ... Hnm of the order n stage. At most $2^{n+1}$ operating devices could be connected to them. FIG. 5 shows four antennas 50, 60, 70, 80 connected to the outputs S1 and S'1 of the couplers H11, H12. If less than $2^{n+1}$ operating devices are used, the outputs Sn or S'n unconnected to a load device will be connected to a matched load.

FIG. 6 respectively shows an antenna 100, 140 on one of the outputs of the coupler H21, H23 and a matched load at the other output. Two antennas 120, 130, 150, 160 are shown respectively at output of the couplers H22 and H24.

In FIGS. 5 and 6, each phase-shifter means PH1, PH2, ... PHn has been represented by a controllable variable phase-shifter.

Each phase-shifter of an order i stage is connected respectively between an output of a phase-shifter Di and the input of a phase-shifter Di+1 of the next stage. This is only an example. Two phase-shifters could have been used, each placed on an output of each divider. The variable phase-shifters of one and the same stage can be controlled simultaneously. The phase-shifters PH of the $2^n$ switching circuits B1, ... Bm are also controllable simultaneously.

The phase-shifters PHn of the order n stage are connected to the input of the switching circuits B1, ... Bm.

We shall make a more detailed study of the working of the device of FIG. 5. The input E1 of the coupler H11 is connected to the output S of the coupler H of the circuit B1. The input E'1 of the coupler H11 is connected to the output S of the coupler H of the circuit B2.

The input E1 of the coupler H12 is connected to the output S' of the coupler H of the circuit B1. The input E'1 of the coupler H12 is connected to the output S' of the coupler H of the circuit B2. It is assumed that only the antenna 60 radiates power. It is powered by the signal S'1 of the coupler H11. The signals E1 and E'1 at input of the coupler H11 are in phase opposition.

The phase-shifter PH1 is controlled so that the signals present at the input of the circuit B1 and of the circuit B2 are in phase opposition.

At the couplers H, a signal is recovered at the output S and substantially nothing is recovered at the output S'. This means that the variable phase-shifters PH are controlled simultaneously so that the signals injected into the coupler H are in phase.

To switch the signal over to another antenna, it is enough to control the phase-shifters PH and/or the phase-shifter PH1 differently.

The examples described herein do not restrict the scope of the invention, notably as regards the making of the amplifiers, the equalization devices and the load devices.

What is claimed is:

1. A switching device with one input and $2^{n+1}$ outputs for receiving an input signal on said input, and for switching an output signal, corresponding to said input signal after amplification, to one output selected from among said $2^{n+1}$ outputs comprising:

a first cascade of dividers and controllable phase-shifters, with n stages, having one input receiving said input signal and $2^{n+1}$ outputs, for dividing said input signal, $2^n$ switching circuits, each comprising: a coupler with two inputs and two outputs, two amplifiers, each amplifier supplying one input of the coupler, a divider between an output of said first cascade and the amplifiers, and at least a phase-shifter connected between the divider and one amplifier and used to set up signals present at input of said coupler in phase or in phase opposition, a second cascade of couplers with n stages, having $2^{n+1}$ inputs connected to the outputs of the couplers of said $2^n$ switching circuits, and $2^{n+1}$ outputs corresponding to the outputs of the switching device.

2. A switching device according to claim 1, wherein the first cascade comprises, in the i stage, $2^{i-1}$ dividers connected to at least $2^{i-1}$ controllable simultaneously phase-shifters, said $2^{i-1}$ phase-shifters put in phase or in opposition phase supplying the dividers of the i+1 stage.

3. A switching device according to claim 1 or 2 wherein said second cascade comprises in each stage, $2^n$ couplers each having two inputs and two outputs, the outputs of a coupler of a stage supplying two inputs of different couplers of the next stage.

4. A switching device according to claim 1 wherein at most $2^{n+1}$ operating devices are connected to the $2^{n+1}$ outputs of the switching device.

5. A switching device according to claim 4 wherein a matched load is connected to an output of the switching device if said output is not connected to an operating device.

6. A switching device according to claim 1 wherein, the amplifiers of the switching circuits are substantially identical.

7. A switching device according to claim 1 wherein the dividers are power dividers by two.

8. A switching device according to claim 1 wherein the couplers are '180°' couplers.

9. A switching device according to claim 1 wherein a device for equalization of the electrical lengths between the divider and the coupler is positioned in each switching circuit.

10. A switching device according to claim 1 wherein a device for equalization of the amplitudes at input of the coupler is positioned in each switching circuit.

11. A switching device according to claim 9 or 10 wherein a servo-control circuit is inserted between at least one output of the coupler of each switching circuit and said device for the equalization.

* * * * *